(12) United States Patent
Lee

(10) Patent No.: US 7,760,581 B2
(45) Date of Patent: Jul. 20, 2010

(54) ACTIVE DRIVER CONTROL CIRCUIT FOR SEMICONDUCTOR MEMORY APPARATUS

(75) Inventor: Jong-Won Lee, Ichon (KR)

(73) Assignee: Hynix Semiconductor Inc. (KR)

( * ) Notice: Subject to any disclaimer, the term of this patent is extended or adjusted under 35 U.S.C. 154(b) by 264 days.

(21) Appl. No.: 11/963,035

(22) Filed: Dec. 21, 2007

(65) Prior Publication Data

US 2008/0253219 A1 Oct. 16, 2008

(30) Foreign Application Priority Data

Apr. 12, 2007 (KR) .................. 10-2007-0035947

(51) Int. Cl.
*G11C 8/00* (2006.01)
(52) U.S. Cl. .............. 365/230.06; 365/233.1; 365/233.19
(58) Field of Classification Search ........... 365/230.06, 365/233.19, 233.1; 711/167, 105
See application file for complete search history.

(56) References Cited

U.S. PATENT DOCUMENTS

| 6,150,860 | A | 11/2000 | Chun |
| 6,166,993 | A * | 12/2000 | Yamauchi ............ 365/233.5 |
| 6,240,045 | B1 * | 5/2001 | Haraguchi et al. ....... 365/233.1 |
| 6,522,193 | B2 | 2/2003 | Shin |
| 6,920,524 | B2 * | 7/2005 | Lovett ............... 711/106 |
| 6,958,947 | B2 | 10/2005 | Park et al. |
| 7,046,074 | B2 | 5/2006 | Jang |
| 2004/0155701 | A1 | 8/2004 | Kim et al. |
| 2006/0140020 | A1 | 6/2006 | Do |
| 2009/0161451 | A1 * | 6/2009 | Kim ............... 365/191 |

FOREIGN PATENT DOCUMENTS

| JP | 2003-030985 | 1/2003 |
| JP | 2005-318034 | 11/2005 |
| KR | 1019980069263 | 10/1998 |
| KR | 1020030017133 A | 3/2003 |

OTHER PUBLICATIONS

"Double Data Rate (DDR) SDRAM Specification," Mar. 2003, JEDEC Solid State Technology Association, JEDEC Standard JESD79C (Revision of JESD79B), pp. 3-6, 12, 14-21.*

* cited by examiner

*Primary Examiner*—Tuan T Nguyen
*Assistant Examiner*—R Lance Reidlinger
(74) *Attorney, Agent, or Firm*—Baker & McKenzie LLP

(57) ABSTRACT

An active driver control circuit for a semiconductor memory apparatus includes an asynchronous decoding unit that can be activated in response to a bank selection signal, when an external command is a read or write command, can generate an enabled read/write enable signal, and when a precharge signal is enabled, disable the enabled read/write enable signal, a synchronous decoding unit that can be activated in response to the bank selection signal, can generate an enabled active enable signal when the external command is an active command, when the external command is a precharge command, can generate the precharge signal, and output the active enable signal and the precharge signal in synchronization with a clock, and an active driver control signal generating unit that can generate an active driver control signal in response to the active enable signal and the read/write enable signal.

15 Claims, 3 Drawing Sheets

ACTIVE DRIVER CONTROL CIRCUIT FOR SEMICONDUCTOR MEMORY APPARATUS

CROSS-REFERENCE TO RELATED PATENT APPLICATION

This application claims the benefit under 35 U.S.C. 119(a) of Korean Patent Application No. 10-2007-0035947, filed on Apr. 12, 2007, in the Korean Intellectual Property Office, the disclosure of which is incorporated herein in its entirety by reference as if set forth in full.

BACKGROUND

1. Technical Field

The disclosure herein relates to a semiconductor memory apparatus, and in particular, to an active driver control circuit for a semiconductor memory apparatus.

2. Related Art

Some conventional semiconductor memory apparatus use a synchronization mode that allows the semiconductor memory apparatus to operate in synchronization with a clock. Such a semiconductor memory apparatus receives an external clock to generate an internal clock. The internal clock is used for the internal operation of the semiconductor memory apparatus. That is, the semiconductor memory apparatus performs an operation to store data and an operation to output stored data in synchronization with the internal clock.

The operation to store data is referred to as a write operation and is performed according to a write command. The operation to output stored data is referred to as a read operation and is performed according to a read command. The read command and the write command can be generated external to the semiconductor memory apparatus.

When the semiconductor memory apparatus performs the read or write operation, a bank is first activated, and then data is stored in or output from the bank. After the read or write information the semiconductor memory apparatus performs a precharge operation for a next read or write operation.

As a result, the semiconductor memory apparatus operates in synchronization with the internal clock to perform the activation operation, the read or write operation, and the precharge operation. After the activation operation is completed, a conventional semiconductor memory apparatus waits to perform a read or write operation until the read or write command is received. This waiting period is referred to as an active standby mode.

A conventional semiconductor memory apparatus uses a standby driver to reduce power consumption during the active standby mode. But if the read or write command is received during this period, then the semiconductor memory apparatus needs to drive a driver at the level needed for an activation operation. During this time, the driving ability of the standby driver is inferior to that of the active driver.

Generally, an active driver is driven on a rising edge of the internal clock after the read or write command is received. Accordingly, there is a delay between a time when the read or write command is received and a time when the active driver can be driven. As a result of the delay, the semiconductor memory apparatus cannot always perform a normal read or write operation. This mainly affects the write operation, in which more power is consumed than during the read operation.

SUMMARY

Embodiments herein provide an active driver control circuit that can drive an active driver at the same time a read or write command is input. According to one embodiment, an active driver control circuit for a semiconductor memory apparatus can include an asynchronous decoding unit that can be activated in response to a bank selection signal, and enable a read/write enable signal in response to a read or write command, a synchronous decoding unit that can be activated in response to the bank selection signal, or if an active command is received, can enable an active enable signal, output the active enable signal in synchronization with a clock, and an active driver control signal generating unit configured to generate an active driver control signal in response to the active enable signal and the read/write enable signal.

These and other features, aspects, and embodiments are described below in the section entitled "Detailed Description."

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

An active driver control circuit for a semiconductor memory apparatus can be configured to enable an active driver if an external command (cmd) is a write command, a read command, or an active command, and to disable the active driver if a precharge command is received. The active driver can be enabled and disabled in response to an active driver control signal.

Figure 1:
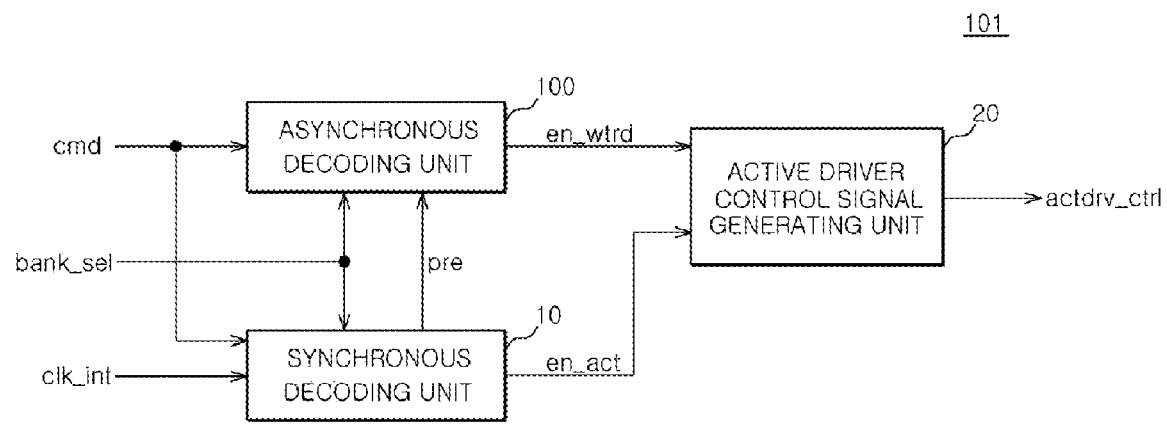
FIG. 1 is a block diagram of an active driver control circuit for a semiconductor memory apparatus according to one embodiment.

FIG. 1 is a block diagram of an active driver control circuit for a semiconductor memory apparatus according to an embodiment. As shown in FIG. 1, the active driver control circuit 101 can include an asynchronous decoding unit 100, a synchronous decoding unit 10, and an active driver control signal generating unit 20.

After a bank selection signal (bank_sel) is activated, if the external command (cmd) is a read command or the write command, the asynchronous decoding unit 100 can enable read/write enable signal (en_wtrd). Further, if a precharge signal ((pre)) is input, the asynchronous decoding unit 100 can be configured to disable the read/write enable signal (en_wtrd).

After the bank selection signal (bank_sel) is enabled, the synchronous decoding unit 10 can be configured to generate an active enable signal (en_act) if the external command (cmd) is the active command, and can be configured to generate the precharge signal (pre) if the external command (cmd) is the precharge command. At this time, the active enable signal (en_act) and the precharge signal (pre) can be output in synchronization with an internal clock (clk_int) (hereinafter, simply referred to as "clock").

The active driver control signal generating unit 20 can be configured to generate the active driver control signal (actdrv_ctrl) in response to the read/write enable signal (en_wtrd) and the active enable signal (en_act). At this time, the active driver control signal generating unit 20 can enable the active driver control signal (actdrv_ctrl) if the read/write enable signal (en_wtrd) or the active enable signal (en_act) is enabled. That is, the active driver control signal generating unit 20 can receive the read/write enable signal (en_wtrd) and the active enable signal (en_act), and perform an OR operation. Therefore, the active driver control signal generating unit 20 can be implemented, for example, by an OR gate.

Figure 2:
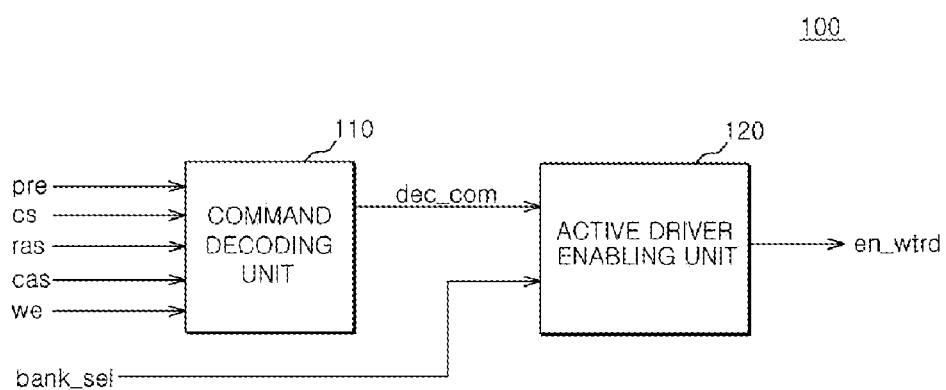
FIG. 2 is a block diagram of an asynchronous decoder that can be included in the circuit illustrated in FIG. 1.

FIG. 2 is a block diagram of an asynchronous decoding unit 100 that can be included in the diagram illustrated in shown in FIG. 1. As shown in FIG. 2, the asynchronous decoding unit 100 can include a command decoding unit 110 and an active driver enabling unit 120. Further, the asynchronous decoding unit 100 can be configured to receive a chip selection signal (cs), a row address strobe signal (ras), a column address strobe signal (cas), and a write enable signal (we) as the external command (cmd).

When the chip selection signal (cs) and the column address strobe signal (cas) are both at a low level, the row address strobe signal (ras) is at a high level, and if the write enable signal (we) is at a high level, then the command decoding unit 110 can recognize the external command as the read command and enables the decoding signal (dec_com).

When the chip selection signal (cs) and the column address strobe signal (cas) are both low, the row address strobe signal (ras) is high, and if the write enable signal (we) is low, then the command decoding unit 110 can recognize the external command as the write command and enable the decoding signal (dec_com).

The command decoding unit 110 can be configured to disable the enabled the decoding signal (dec_com) when the precharge signal (pre) is enabled, that is, at a high level.

The active driver enabling unit 120 can be configured to output the decoding signal (dec_com) as the read/write enable signal (en_wtrd) when the bank selection signal (bank_sel) is enabled, that is, at a high level.

Figure 3:
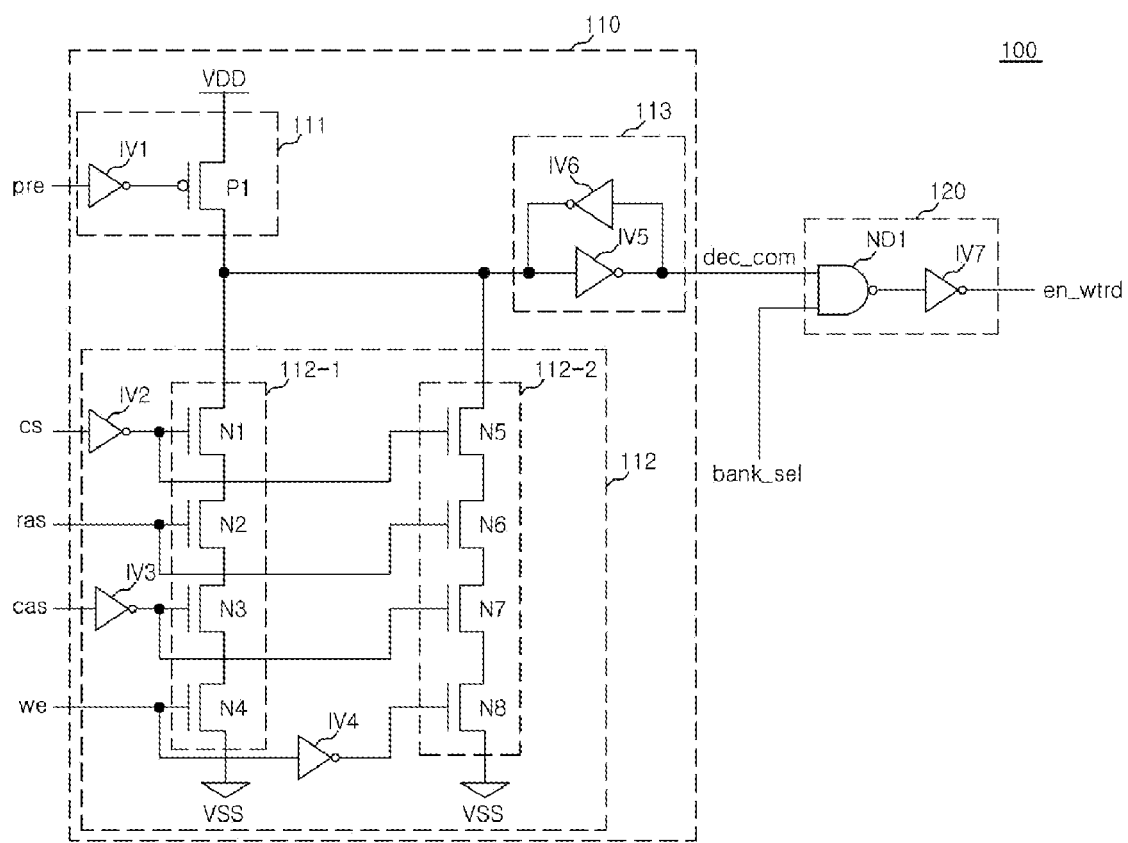
FIG. 3 is a detailed circuit diagram of an asynchronous decoder that can be included in the circuit illustrated in FIG. 2.

FIG. 3 is a detailed circuit diagram of the command decoding unit 110 that can be included in the asynchronous decoding unit 100 illustrated in FIG. 2. As shown in FIG. 3, the command decoding unit 110 can include a disabling unit 111, an enabling unit 112, and a latch unit 113. The disabling unit 111 can be configured to output an external voltage (VDD) when the precharge signal (pre) is enabled, that is, at a high level.

The disabling unit 111 can be configured to include a first inverter IV1 and a first transistor P1 as switching elements. The first inverter IV1 can be configured to invert the precharge signal (pre). The first transistor P1 can include a gate, to which an output signal of the first inverter IV1 is input, a source, to which the external voltage VDD is supplied, and a drain that functions as an output terminal of the disabling unit 111.

The enabling unit 112 can be configured to connect an output terminal of the enabling unit 112 to a ground terminal VSS in response to the chip selection signal (cs), the row address strobe signal (ras), the column address strobe signal (cas), and the write enable signal (we).

The enabling unit 112 can include a read command recognizing unit 112-1 and a write command recognizing unit 112-2. The enabling unit 112 can also include second to fourth inverters IV2, IV3, and IV4. The second inverter IV2 can invert the chip selection signal (cs). The third inverter IV3 can invert the column address strobe signal (cas). The fourth inverter IV4 can invert the write enable signal (we).

When the chip selection signal (cs) and the column address strobe signal (cas) are both low, the row address strobe signal (ras) is high, and if the write enable signal (we) is high, then the read command recognizing unit 112-1 can be configured to connect an output terminal of the read command recognizing unit 112-1 to a ground terminal VSS. The output terminal of the read command recognizing unit 112-1 can be an output terminal of the command decoding unit 110.

The read command recognizing unit 112-1 can include second to fifth transistors N1, N2, N3, and N4 as switching elements. The second transistor N1 can include a gate, to which an output signal of the second inverter IV2 is input, a drain that is the output terminal of the read command recognizing unit 112-1, and a source that is connected to a drain of the third transistor N2. The third transistor N2 can include a gate, to which the row address strobe signal (ras) is input, a drain that is connected to the source of the second transistor N1, and a source that is connected to a drain of the fourth transistor N3. The fourth transistor N3 can include a gate, to which an output signal of the third inverter IV3 is input, a drain that is connected to the source of the third transistor N2, and a source that is connected to a drain of the fifth transistor N4. The fifth transistor N4 can include a gate, to which the write enable signal (we) is input, a drain that is connected to the source of the fourth transistor N3, and a source that is connected to the ground terminal VSS.

When the chip selection signal (cs) and the column address strobe signal (cas) are both at the low level, and the row address strobe signal (ras) is at the high level, and if the write enable signal (we) is at the low level, the write command recognizing unit 112-2 can be configured to connect an output terminal of the write command recognizing unit 112-2 to the ground terminal VSS. The output terminal of the write command recognizing unit 112-2 can be an output terminal of the command decoding unit 110.

The write command recognizing unit 112-2 can include sixth to ninth transistors N5, N6, N7, and N8 as switching elements. The sixth transistor N5 can include a gate, to which the output signal of the second inverter IV2 is input, a drain that is the output terminal of the write command recognizing unit 112-2, and a source that is connected to a drain of the seventh transistor N6. The seventh transistor N6 can include a gate, to which the row address strobe signal (ras) is input, a drain that is connected to the source of the sixth transistor N5, and a source that is connected to a drain of the eighth transistor N7.

The eighth transistor N7 can include a gate, to which the output signal of the third inverter IV3 is input, a drain that is connected to the source of the seventh transistor N6, and a source that is connected to a drain of the ninth transistor N8. The ninth transistor N8 can include a gate, to which an output signal of the fourth inverter IV4 is input, a drain that is connected to the source of the eighth transistor N7, and a source that is connected to the ground terminal VSS. At this time, the level of a connection node of the output terminals of the read command recognizing unit 112-1, the write command recognizing unit 112-2, and the disabling unit 111 can input to the latch unit 113.

The latch unit 113 can be configured to invert the level on the connection node of the enabling unit 112 and the disabling unit 111, to output the inverted level as the level of the decoding signal (dec_com).

The latch unit 113 can include a fifth inverter IV5 and a sixth inverter IV6. The fifth inverter IV5 can include an input terminal, to which the connection node of the disabling unit 111 and the enabling unit 112 can be connected, and an output terminal, from which the decoding signal (dec_com) can be output. The sixth inverter IV6 receives an output signal of the fifth inverter IV5 to output the received signal as an input signal of the fifth inverter IV5.

The active driver enabling unit 120 can be configured to output the decoding signal (dec_com) as the read/write enable signal (en_wtrd) if the bank selection signal (bank_sel) is enabled, that is, at a high level. The active driver enabling unit 120 can include a NAND gate ND1 and a seventh inverter IV7. The NAND gate ND1 can be configured to receive the decoding signal (dec_com) and the bank selection signal (bank_sel). The seventh inverter IV7 can invert an output signal of the NAND gate ND1 and output the inverted signal as the read/write enable signal (en_wtrd).

Figure 4:
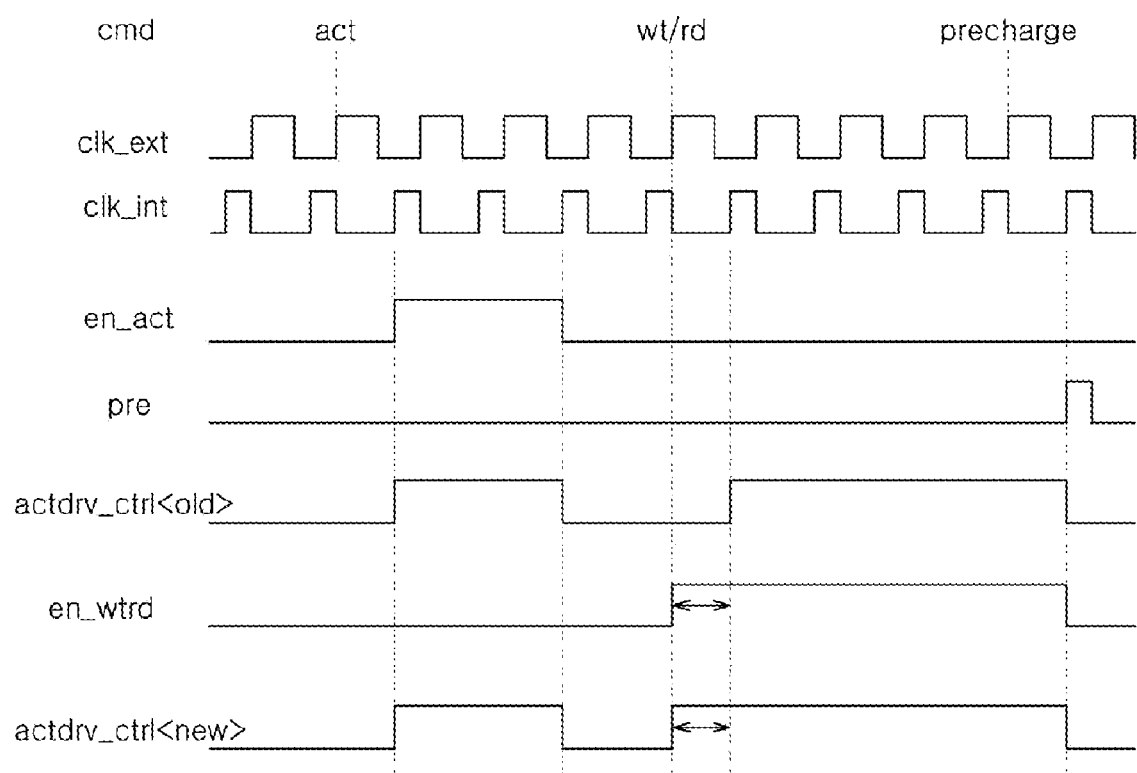
FIG. 4 is a timing diagram illustrating the comparison result of the operation timing of an active driver control circuit for a semiconductor memory apparatus according to one embodiment with the operation timing of a general active driver control circuit.

FIG. 4 is a timing diagram illustrating the comparison result of the operational timing of an active driver control circuit for a semiconductor memory apparatus according to one embodiment with the operational timing of a general active driver control circuit. The external command (cmd) can be input to the semiconductor memory apparatus in synchronization with a rising edge of an external clock (clk_ext), and the semiconductor memory apparatus can operate in synchronization with a rising edge of the internal clock (clk_int). In addition, the internal clock (clk_int) can be generated on the basis of the external clock (clk_ext). For convenience of explanation, the internal clock (clk_int) is simply referred to as the clock (clk_int).

The semiconductor memory apparatus can be configured to operate in synchronization with the rising edge of the clock (clk_int). If an active command (act) is received, the active enable signal (en_act), which is enabled at the rising edge of the clock (clk_int), can be generated. The active enable signal (en_act) that is maintained at the high level can be disabled according to the precharge signal (pre), which is generated at the rising edge of the clock (clk_int), if a precharge command (precharge) is received.

A write or read command (wt)/(rd) is input between the active command (act) and the precharge command (precharge).

The general active driver control circuit can be configured to generate an active driver control signal (actdrv_ctrl)(old), which is transited to the high level when the active enable signal (en_act) is transited to the high level, and can be configured to disable the active driver control signal (actdrv_ctrl)(old) at the low level after predetermined time elapses. Further, if the write or read command (wt)/(rd) is input after the active driver control signal (actdrv_ctrl)(old) is transited to the low level, the active driver control signal (actdrv_ctrl)(old) can be transition to the high level at the rising edge of the clock (clk_int). If the active enable signal (en_act)(old) is transitioned to the high level, the active driver control signal (actdrv_ctrl)(old) can be transition to the high level, and the active driver control signal (actdrv_ctrl)(old), which was transitioned to the high level, can be transitioned to the low level after predetermined time elapses.

One reason why the active driver control signal (actdrv_ctrl), which was transitioned to the high level according to the active command (act), is transitioned to the low level after predetermined time elapses is to reduce power consumption. If the write or read command (wt)/(rd) is input, the active driver control signal (actdrv_ctrl)(old) is transitioned to the high level again to operate the active driver. A period from when the active command (act) is input until the read or write command (wt)/(rd) is input is called the active standby mode.

In the active driver control circuit 101 configured in accordance with the embodiments described herein, if the read or write command (wt)/(rd) is received, the read/write enable signal (en_wtrd) can be transitioned to the high level regardless of the clock (clk_int). Accordingly, the active driver control signal (actdrv_ctrl)(new) can also be transitioned to the high level at the same time with the read/write enable signal (en_wtrd).

The active driver control circuit 101 according to one embodiment described herein, can be configured to generate the active driver control signal (actdrv_ctrl)(new), which is enabled faster than the general active driver control circuit during the active standby mode. Therefore, it is possible to operate the active driver faster than the related art. The active driver control circuit 101 can be configured to drive at the same time the read or write command is input from the outside. As a result, the internal power supply in the semiconductor memory apparatus can be stabilized, and thus operation stability can be improved.

While certain embodiments have been described above, it will be understood that the embodiments described are by way of example only. Accordingly, the apparatus and methods described herein should not be limited based on the described embodiments. Rather, the apparatus and methods described herein should only be limited in light of the claims that follow when taken in conjunction with the above description and accompanying drawings.

What is claimed is:

1. An active driver control circuit for a semiconductor memory apparatus comprising:
    a first signaling unit that generates a read/write enable signal, which is enabled at the same time a read command or a write command is input regardless of a clock;
    a second signaling unit that outputs an active enable signal, which is enabled according to an active command, in synchronization with the clock; and
    an active driver control signal generating unit that generates an active driver control signal in response to the active enable signal and the read/write enable signal.

2. The active driver control circuit of claim 1,
    wherein an external command including the read command, the write command, and the active command includes a chip selection signal, a row address strobe signal, a column address strobe signal, and a write enable signal.

3. The active driver control circuit of claim 2,
    wherein the second signaling unit is a synchronous decoding unit that generates a precharge signal synchronized with the clock when the external command is a precharge command, and
    the first signaling unit is an asynchronous decoding unit that, when the chip selection signal and the column address strobe signal are both at a low level, and the row address strobe signal is at a high level, determines either the read command or the write command according to the level of the write enable signal.

4. The active driver control circuit of claim 3,
    wherein the asynchronous decoding unit includes:
    a command decoding unit that decodes the chip selection signal, the row address strobe signal, the column address strobe signal, and the write enable signal to generate an enabled decoding signal, and if the precharge signal is enabled, disables the decoding signal; and an active driver enabling unit that generates the read/write enable signal in response to the bank selection signal and the decoding signal.

5. The active driver control circuit of claim 4, wherein the command decoding unit recognizes the external command as the write command to generate the enabled decoding signal, when the chip selection signal and the column address strobe signal are both at the low level, and the row address strobe signal is at the high level, and if the write enable signal is at the low level, and recognizes the external command as the read command to generates the enabled decoding signal when the chip selection signal and the column address strobe signal are both at the low level, and the row address strobe signal is at the high level, and if the write enable signal is at the high level.

6. The active driver control circuit of claim 5, wherein the command decoding unit disables the decoding signal if the precharge signal is enabled.

7. The active driver control circuit of claim 6, wherein the command decoding unit includes:

a disabling unit that disables the decoding signal in response to the precharge signal;

an enabling unit that enables the decoding signal in response to the chip selection signal, the row address strobe signal, the column address strobe signal, and the write enable signal; and a latch unit that maintains the level of the decoding signal.

8. The active driver control circuit of claim 7,

Wherein the command decoding unit is configured to connect a node between the disabling unit and the enabling unit with the latch unit, wherein an output signal of the latch unit is the decoding signal.

9. The active driver control circuit of claim 8, wherein the disabling unit outputs an external voltage in response to the precharge signal.

10. The active driver control circuit of claim 9, wherein the disabling unit include a switching element.

11. The active driver control circuit of claim 8, wherein the enabling unit includes:

a read command recognizing unit that determines the external command as the read command, in case of the write enable signal is at the high level at state of the chip selection signal and the column address strobe signal are both at the low level, and the row address strobe signal is at the high level; and a write command recognizing unit that determines the external command as the write command, in case of the write enable signal is at the low level at state of the chip selection signal and the column address strobe signal are both at the low level, and the row address strobe signal is at the high level.

12. The active driver control circuit of claim 11, wherein the read command recognizing unit is configured to connect an output terminal of the enabling unit to a ground terminal, when the external command is recognized to the read command.

13. The active driver control circuit of claim 12, wherein the read command recognizing unit includes a plurality of switching elements.

14. The active driver control circuit of claim 11, wherein the write command recognizing unit is configured to connect an output terminal of the enabling unit to a ground terminal, when the external command is recognized to the write command.

15. The active driver control circuit of claim 4, wherein the active driver enabling unit outputs the decoding signal as the read/write enable signal when the bank selection signal is enabled.

* * * * *